(12) United States Patent
Naaman et al.

(10) Patent No.: US 10,122,351 B1
(45) Date of Patent: Nov. 6, 2018

(54) SUPERCONDUCTING BI-DIRECTIONAL CURRENT DRIVER

(71) Applicants: Ofer Naaman, Ellicott City, MD (US); Donald L. Miller, Export, PA (US); Randall M. Burnett, Catonsville, MD (US)

(72) Inventors: Ofer Naaman, Ellicott City, MD (US); Donald L. Miller, Export, PA (US); Randall M. Burnett, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/659,005

(22) Filed: Jul. 25, 2017

(51) Int. Cl.
  *G11C 7/00* (2006.01)
  *H03K 3/38* (2006.01)
  *G11C 7/12* (2006.01)

(52) U.S. Cl.
  CPC ................. *H03K 3/38* (2013.01); *G11C 7/12* (2013.01)

(58) Field of Classification Search
  CPC .................................. H03K 3/38; G11C 7/12
  USPC ..................................................... 365/189.16
  See application file for complete search history.

(56) References Cited

U.S. PATENT DOCUMENTS

| | | | | |
|---|---|---|---|---|
| 4,360,898 A | * | 11/1982 | Faris | H03K 19/1952 365/160 |
| 5,051,627 A | * | 9/1991 | Schneier | H03K 19/1952 326/4 |
| 6,960,929 B2 | * | 11/2005 | Bedard | H03K 17/92 326/1 |

* cited by examiner

*Primary Examiner* — Tha-O H Bui
(74) *Attorney, Agent, or Firm* — Tarolli, Sundheim, Covell & Tummino LP

(57) ABSTRACT

One example includes a superconducting bidirectional current driver. The current driver includes a first direction superconducting latch that is activated in response to a first activation signal and a second direction superconducting latch that is activated in response to a second activation signal. The second direction superconducting latch is activated to provide a first current path of an input current through the first direction superconducting latch and through a bidirectional current load in a first direction. The first direction superconducting latch is activated to provide a second current path of the input current through the second direction superconducting latch and through the bidirectional current load in a second direction opposite the first direction.

20 Claims, 5 Drawing Sheets

SUPERCONDUCTING BI-DIRECTIONAL CURRENT DRIVER

TECHNICAL FIELD

This disclosure relates generally to quantum and classical circuit systems, and specifically to a superconducting bidirectional current driver.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical signal power of around 4 nW (nanowatts) at a typical data rate of 20 Gb/s (gigabytes/second) or greater, and can operate at temperatures of around 4 Kelvin. Superconducting circuits in a variety of applications, such as memory and quantum processors, can require a current to be applied to certain load devices (e.g., an inductor) in the circuit for a certain amount of time. For example, in a memory circuit, the current can be applied as a "write" signal applied to a bit or word write line, in quantum information the current can be a flux bias signal to a qubit, or in other superconducting applications, the current may be a programming or enable line. In some such applications, the applied current may be required to be bidirectional.

SUMMARY

One example includes a superconducting bidirectional current driver. The current driver includes a first direction superconducting latch that is activated in response to a first activation signal and a second direction superconducting latch that is activated in response to a second activation signal. The second direction superconducting latch is activated to provide a first current path of an input current through the first direction superconducting latch and through a bidirectional current load in a first direction. The first direction superconducting latch is activated to provide a second current path of the input current through the second direction superconducting latch and through the bidirectional current load in a second direction opposite the first direction.

Another example includes a method for providing a superconducting current through a bidirectional current load in a first direction or a second direction. The method includes generating an input current via a current source. The method also includes providing a first activation signal to a respective first direction superconducting latch to activate the first direction superconducting latch to provide a current path for the input current from the current source through a second direction superconducting latch and through the bidirectional current load in the second direction. The method further includes providing a second activation signal to the respective second direction superconducting latch to activate the second direction superconducting latch to provide a current path for the input current from the current source through the first direction superconducting latch and through the bidirectional current load in the first direction.

Another example includes a bidirectional memory write current driver. The memory write current driver includes a current source configured to generate an input current and a write line associated with at least one of a row or a column of a memory array. The write line can be configured to write a first memory state of at least one memory cell of the respective at least one of the row or the column based on the input current being provided through the write line in a first direction and to write a second memory state of the at least one memory cell of the respective at least one of the row or the column based on the input current being provided through the write line in a second direction opposite the first direction. The memory write current driver also includes a superconducting bidirectional current driver. The current driver includes a first direction superconducting latch that is activated in response to a first activation signal and a second direction superconducting latch that is activated in response to a second activation signal. The second direction superconducting latch is activated to provide a first current path of the input current through the first direction superconducting latch and through the write line in the first direction. The first direction superconducting latch is activated to provide a second current path of the input current through the second direction superconducting latch and through the write line in the second direction.

DETAILED DESCRIPTION

This disclosure relates generally to quantum and classical circuit systems, and specifically to a superconducting bidirectional current driver. The superconducting bidirectional current driver is configured to provide current in one of a first direction and a second direction through a bidirectional current load. As an example, the bidirectional current load can be configured as an inductive load, such that the inductive load can be inductively coupled to or can correspond to a write-current line in a memory system to write a first logic state in a memory cell based on the current flowing in a first direction through the inductive load and to write a second logic state in the memory cell based on the current flowing in a second direction through the inductive load. The superconducting bidirectional current driver includes a plurality of superconducting latches that are selectively activated to provide a current path for an input current that is provided from a current source through non-activated superconducting latches and through the bidirectional current load in one of the first and second directions.

As an example, each of the superconducting latches can be configured as a quantum flux device (e.g., a superconducting quantum interference device (SQUID) or a Josephson junction device) that is activated to switch to a voltage state. The activation of the superconducting latches can be performed via activation signals provided from an activation controller. Thus, in response to being switched to the voltage state, the superconducting latch acts as a resistive element by diverting current from flowing through it. Therefore, the superconducting bidirectional current driver steers current through the bidirectional current load based on the selective activation of the superconducting latches. For example, the superconducting bidirectional current driver can be configured as an H-bridge circuit that includes complementary pairs of the superconducting latches that are activated to provide the input current through the bidirectional current load in the respective first and second directions. As another example, the superconducting bidirectional current driver can be configured as an A-bridge circuit that includes a pair of superconducting latches that are selectively activated to provide the input current through the bidirectional current load in the respective first and second directions and through a pair of inductors.

Figure 1:
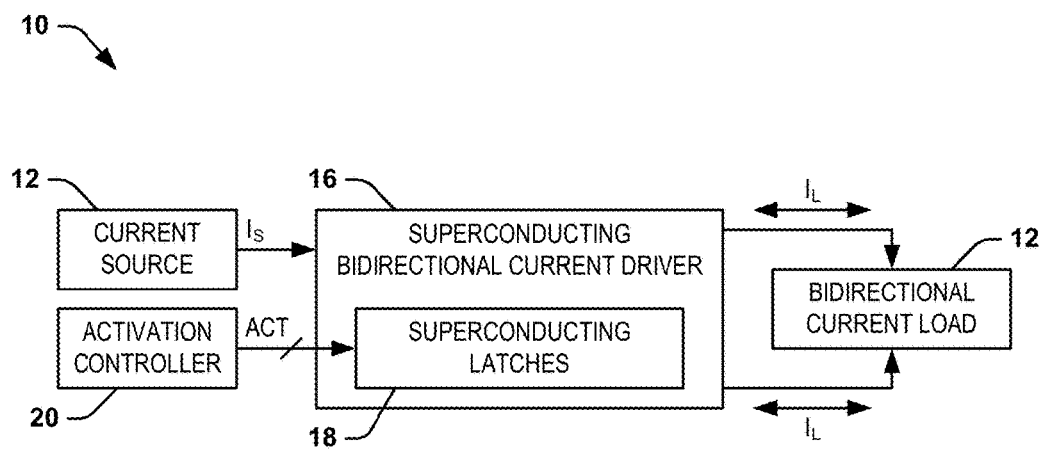
FIG. 1 illustrates an example of a superconducting bidirectional current driver system.

FIG. 1 illustrates an example of a superconducting bidirectional current driver system 10. The superconducting bidirectional current driver system 10 can be implemented in any of a variety of applications, such as in quantum or classical computer systems, to provide bidirectional current flow through a bidirectional current load 12. As described in greater detail herein, the bidirectional current load 12 can be configured as an inductive load, such that the inductive load can be inductively coupled to or can function as a write-current line in a memory system to write a first logic state or a second logic state in a memory cell.

The superconducting bidirectional current driver system 10 also includes a current source 14 configured to generate an input current $I_S$. As an example, the current source 14 can be configured as a flux shuttle or flux pump that is configured to generate the input current $I_S$ based on the sequential triggering of a sequence of Josephson junctions about a loop, with each triggering of a Josephson junction generating a current increment that is stored in a storage inductor. The superconducting bidirectional current driver system 10 also includes a superconducting bidirectional current driver 16 that receives the input current $I_S$ and is configured to provide the input current $I_S$ through the bidirectional current load 12 as a load current $I_L$ in one of a first direction or a second direction. In the example of FIG. 1, the superconducting bidirectional current driver 16 includes a plurality of superconducting latches 18 that are selectively activated to control the direction of the load current $I_L$ through the bidirectional current load 12. The superconducting latches 18 are activated via respective activation signals ACT that are provided from an activation controller 20, such that the activation controller 20 can provide the appropriate activation signals ACT to activate the respective superconducting latches 18 that correspond to the desired direction of the load current $I_L$ through the bidirectional current load 12. As an example, the activation signals ACT can be provided as single flux quantum (SFQ) pulses or reciprocal quantum logic (RQL) pulses.

Figure 2:
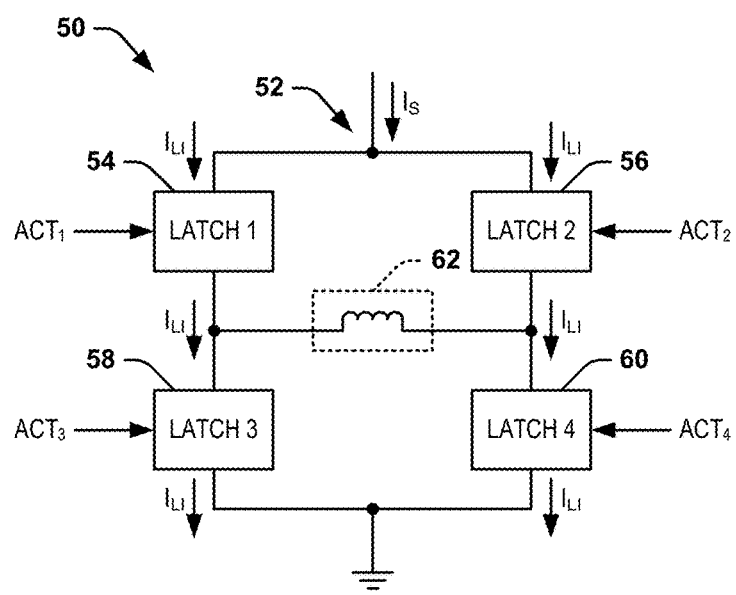
FIG. 2 illustrates an example of a superconducting bidirectional current driver.

FIG. 2 illustrates an example of a superconducting bidirectional current driver 50. The superconducting bidirectional current driver 50 can correspond to the superconducting bidirectional current driver 16 in the example of FIG. 1. Therefore, reference is to be made to the example of FIG. 1 in the following description of the example of FIG. 2.

In the example of FIG. 2, the superconducting bidirectional current driver 50 is demonstrated as an H-bridge circuit that is arranged between a node 52 and a low-voltage rail, demonstrated as ground. The input current $I_S$ is provided to the node 52, such as from the current source 14. The superconducting bidirectional current driver 50 includes a first superconducting latch 54, a second superconducting latch 56, a third superconducting latch 58, and a fourth superconducting latch 60 that are arranged in an H-bridge formation with respect to a bidirectional current load, demonstrated as an inductor 62. In the example of FIG. 2, the superconducting latch 54 is demonstrated as being activated via a respective activation signal $ACT_1$, the superconducting latch 56 is demonstrated as being activated via a respective activation signal $ACT_2$, the superconducting latch 58 is demonstrated as being activated via a respective activation signal $ACT_3$, and the superconducting latch 60 is demonstrated as being activated via a respective activation signal $ACT_4$. As an example, the activation signals $ACT_1$, $ACT_2$, $ACT_3$, and $ACT_4$ are provided by the activation controller 20, and can be inductively coupled to the respective superconducting latches 54, 56, 58, and 60. For example, the superconducting latches 54, 56, 58, and 60 are configured as quantum flux devices (e.g., SQUIDs or Josephson junction devices) that are configured to switch to a voltage state in response to the respective activation signals $ACT_1$, $ACT_2$, $ACT_3$, and $ACT_4$, such as based on the sequential alternate triggering of Josephson junctions. As an example, the activation signals $ACT_1$, $ACT_2$, $ACT_3$, and $ACT_4$ can be provided as SFQ pulses or RQL pulses. As an example, the superconducting latches 54, 56, 58, and 60 can switch back to a superconducting state from the voltage state after expiration of a predetermined duration of time or when the amplitude of the latch current has reduced below a predetermined threshold.

In the example of FIG. 2, the superconducting bidirectional current driver 50 is demonstrated in an idle state, such that no current flows through the inductor 62. As an example, the superconducting bidirectional current driver 50 can occupy the idle state at initialization of the superconducting bidirectional current driver 50. The superconducting bidirectional current driver 50 can be arranged in a substantially balanced arrangement, and can thus have zero resistance throughout based on being configured as superconducting. In the idle state, the superconducting latches 54, 56, 58, and 60 can all be superconducting (e.g., having zero resistance), and can thus be configured to conduct the input current substantially equally based on the balanced arrangement. Thus, in the example of FIG. 2, the input current $I_S$ is divided into two current paths: a first current path through the first superconducting latch 54 and the third superconducting latch 58 and a second current path through the second superconducting latch 56 and the fourth superconducting latch 60. The current through each of the current paths is demonstrated as a current $I_{L1}$, which is approximately equal to one half the amplitude of the input current $I_S$.

Figure 3:
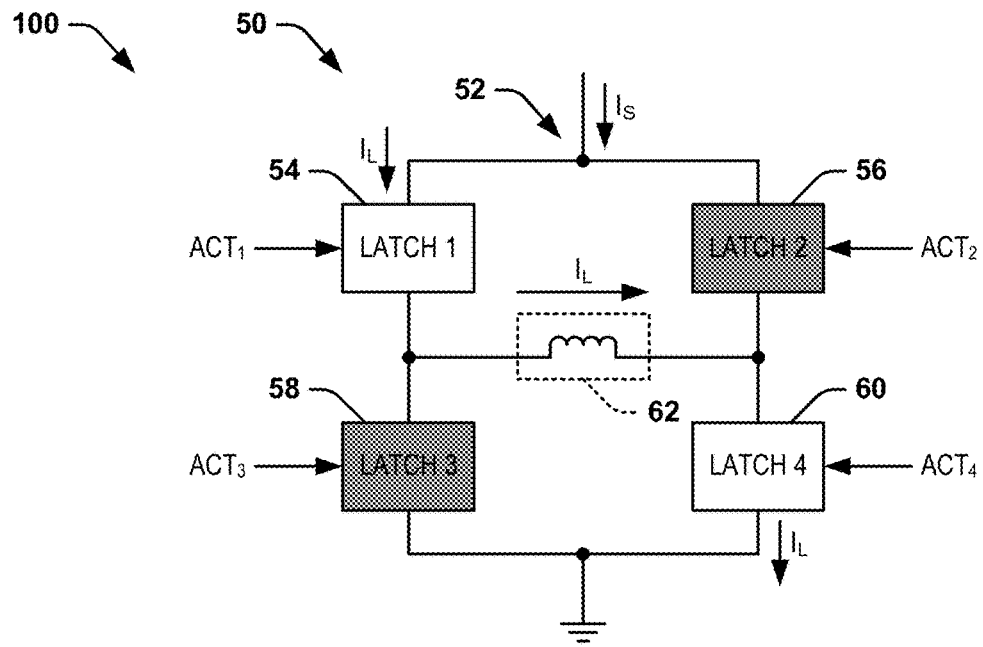
FIG. 3 illustrates an example diagram of current direction in the superconducting bidirectional current driver.

FIG. 3 illustrates an example diagram 100 of current direction in the superconducting bidirectional current driver 50. The diagram 100 corresponds to the superconducting bidirectional current driver 50 in the example of FIG. 2. Therefore, like reference numbers are used in the description of the example of FIG. 3 as provided in the example of FIG.

2, and reference is to be made to the examples of FIGS. 1 and 2 in the following description of the example of FIG. 3.

The diagram 100 demonstrates a first current state of the input current $I_S$ through the inductor 62. In the example of FIG. 3, the activation signals $ACT_2$ and $ACT_3$ have been provided to the receptive superconducting latches 56 and 58. As an example, the activation signals $ACT_2$ and $ACT_3$ can be provided to the superconducting bidirectional current driver 50 having been in the idle state (e.g., in the example of FIG. 2) or having been in a second current state (e.g., in the example of FIG. 4). Therefore, in response the receiving the activation signals $ACT_2$ and $ACT_3$, the superconducting latches 56 and 58 switch to the voltage state (demonstrated in the example of FIG. 3 as shaded), and thus cease to conduct the input current $I_S$ (e.g., as the portion of the current $I_{L1}$ in the idle state or as the current $I_L$ from the second current state). As a result, the diagram 100 demonstrates a load current $I_L$ flowing through the inductor 62 that can have an amplitude that is approximately equal to the input current $I_S$. As an example, the load current $I_L$ can depend on a total inductance of the current path through the non-activated superconducting latches 54, 56, 58, and/or 60 and the inductor 62. Thus, the load inductor 62 can be configured such that the load current $I_L$ flowing through the non-activated latches remains substantially equal to the amplitude of the current flowing through the superconducting latches 54, 56, 58, and 60 in the idle state, such as based on the current source 14 being configured as a flux-pump or if the superconducting bidirectional current driver 50 included an inductive shunt.

Particularly, in the example of FIG. 3, the load current $I_L$ is demonstrating as flowing from the node 52 (e.g., from the current source 14) through the non-activated (e.g., superconducting) superconducting latch 54, through the inductor 62 in a first direction, and through the non-activated superconducting latch 60 to the low-voltage rail. Therefore, in the example of FIG. 3, the superconducting latches 54 and 60 are referred to as "first direction" superconducting latches, as they facilitate the flow of the load current $I_L$ through the inductor 62 in the first direction. After a duration of time, the superconducting latches 56 and 58 return from the voltage state to the non-activated (e.g., superconducting) state. However, based on the superconducting (e.g., zero resistance) state of the superconducting latches 54 and 60, substantially all of the load current $I_L$ can continue to flow through the superconducting latches 54 and 60, and through the inductor 62 in the first direction in the first current state (e.g., a hold state). In the first current state, or hold state, the current $I_L$ can maintain a flux of $\Phi$ with respect to the inductor 62, and can continue to flow indefinitely due to the superconducting configuration of the superconducting bidirectional current driver 50.

Figure 4:
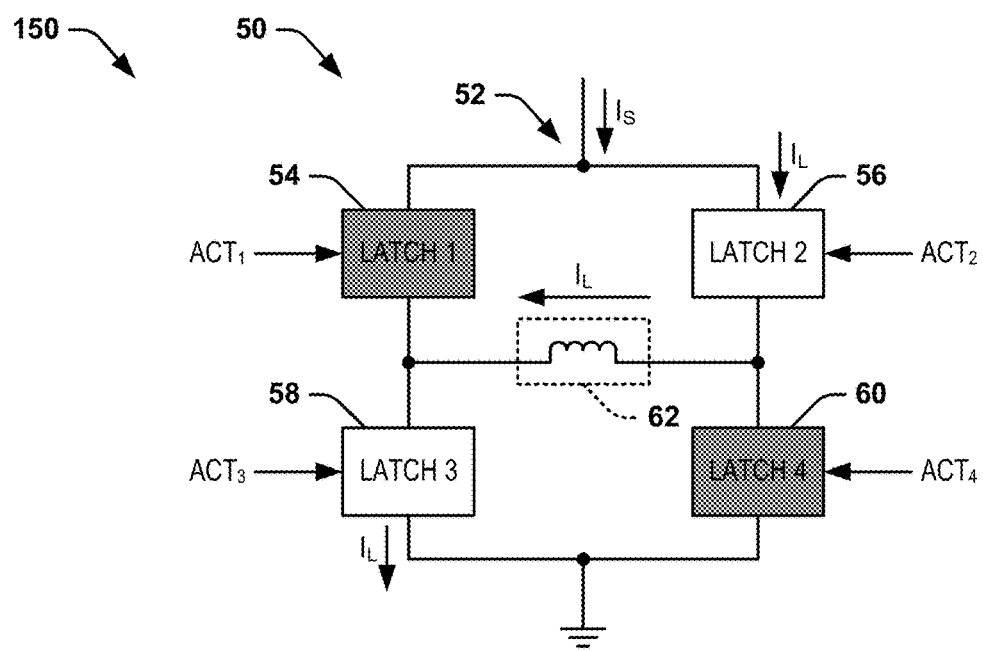
FIG. 4 illustrates another example diagram of current direction in the superconducting bidirectional current driver.

FIG. 4 illustrates another example diagram 150 of current direction in the superconducting bidirectional current driver 50. The diagram 150 corresponds to the superconducting bidirectional current driver 50 in the example of FIGS. 2 and 3. Therefore, like reference numbers are used in the description of the example of FIG. 4 as provided in the example of FIGS. 2 and 3, and reference is to be made to the examples of FIGS. 1-3 in the following description of the example of FIG. 4.

The diagram 150 demonstrates a second current state of the input current $I_S$ through the inductor 62. In the example of FIG. 4, the activation signals $ACT_1$ and $ACT_4$ have been provided to the receptive superconducting latches 54 and 60. As an example, the activation signals $ACT_1$ and $ACT_4$ can be provided to the superconducting bidirectional current driver 50 having been in the idle state (e.g., in the example of FIG. 2) or having been in the first current state (e.g., in the example of FIG. 3). Therefore, in response the receiving the activation signals $ACT_1$ and $ACT_4$, the superconducting latches 54 and 60 switch to the voltage state (demonstrated in the example of FIG. 4 as shaded), and thus cease to conduct the input current $I_S$ (e.g., as the portion of the current $I_{L1}$ in the idle state or as the current $I_L$ from the first current state). As a result, the diagram 150 demonstrates a load current $I_L$ flowing through the inductor 62 that can have an amplitude that is approximately equal to the input current $I_S$, and having a negative amplitude relative to the load current $I_L$ in the example of FIG. 3.

Particularly, in the example of FIG. 4, the load current $I_L$ is demonstrating as flowing from the node 52 (e.g., from the current source 14) through the non-activated (e.g., superconducting) superconducting latch 56, through the inductor 62 in a second direction opposite the first direction, and through the non-activated superconducting latch 58 to the low-voltage rail. Therefore, in the example of FIG. 4, the superconducting latches 56 and 58 are referred to as "second direction" superconducting latches, as they facilitate the flow of the load current $I_L$ through the inductor 62 in the second direction. After a duration of time, the superconducting latches 54 and 60 return from the voltage state to the non-activated (e.g., superconducting) state. However, based on the superconducting (e.g., zero resistance) state of the superconducting latches 56 and 58, substantially all of the load current $I_L$ can continue to flow through the superconducting latches 56 and 58, and through the inductor 62 in the second direction in the second current state (e.g., a hold state). In the second current state, or hold state, the current $I_L$ can maintain a flux of $-\Phi$ with respect to the inductor 62, and can continue to flow indefinitely due to the superconducting configuration of the superconducting bidirectional current driver 50.

Figure 5:
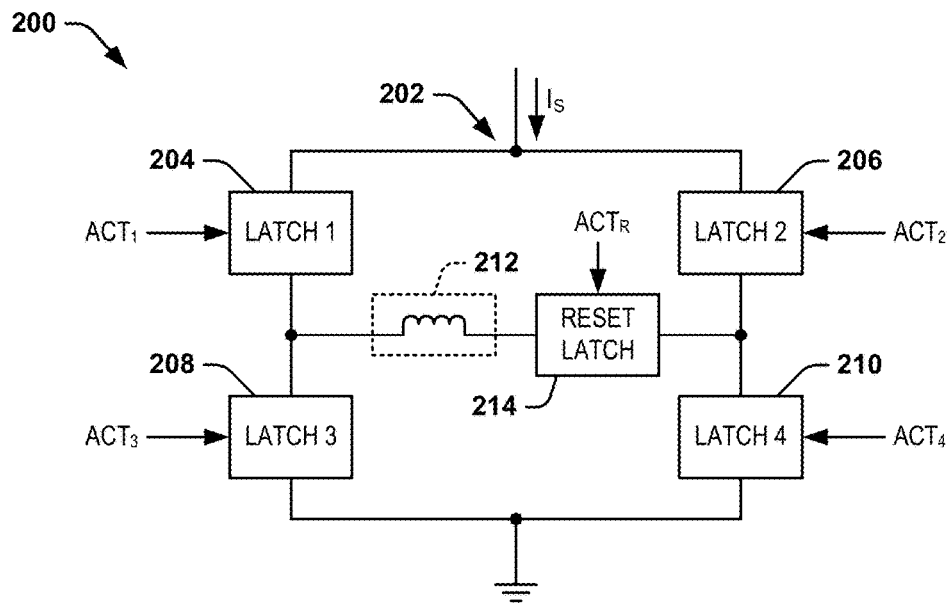
FIG. 5 illustrates another example of a superconducting bidirectional current driver.

FIG. 5 illustrates another example of a superconducting bidirectional current driver 200. The superconducting bidirectional current driver 200 can correspond to the superconducting bidirectional current driver 16 in the example of FIG. 1. Therefore, reference is to be made to the example of FIG. 1 in the following description of the example of FIG. 5.

In the example of FIG. 5, the superconducting bidirectional current driver 200 is demonstrated as an H-bridge circuit that is arranged between a node 202 and a low-voltage rail, demonstrated as ground. The input current $I_S$ is provided to the node 202, such as from the current source 14. The superconducting bidirectional current driver 200 includes a first superconducting latch 204, a second superconducting latch 206, a third superconducting latch 208, and a fourth superconducting latch 210 that are arranged in an H-bridge formation with respect to a bidirectional current load, demonstrated as an inductor 212. In the example of FIG. 5, the superconducting latch 204 is demonstrated as being activated via a respective activation signal $ACT_1$, the superconducting latch 206 is demonstrated as being activated via a respective activation signal $ACT_2$, the superconducting latch 208 is demonstrated as being activated via a respective activation signal $ACT_3$, and the superconducting latch 210 is demonstrated as being activated via a respective activation signal $ACT_4$. As an example, the activation signals $ACT_1$, $ACT_2$, $ACT_3$, and $ACT_4$ are provided by the activation controller 20. For example, the superconducting latches 204, 206, 208, and 210 are configured as quantum flux devices (e.g., SQUIDs) that are configured to switch to a voltage state in response to the respective activation signals $ACT_1$, $ACT_2$, $ACT_3$, and $ACT_4$, and can thus switch back to a superconducting state from the voltage state after expiration of a predetermined duration of time, similar to as described previously.

Therefore, the superconducting bidirectional current driver 200 can be configured similar to the superconducting bidirectional current driver 50 in the example of FIGS. 2-4. Accordingly, the superconducting bidirectional current driver 200 can be switched from the idle state to one of the first current state and the second current state, similar to as described previously in the examples of FIGS. 2-4, respectively. However, in the example of FIG. 5, the superconducting bidirectional current driver 200 also includes a reset superconducting latch 214 that is arranged in series with the inductor 212. While the reset superconducting latch 214 is arranged between the inductor 212 and the superconducting latches 206 and 210, it is to be understood that the reset superconducting latch 214 could instead be arranged between the inductor 212 and the superconducting latches 204 and 208. The reset superconducting latch 214 is configured to receive an activation signal $ACT_R$, such as from the activation controller 20 in the example of FIG. 1, to reset the superconducting bidirectional current driver 200 from one of the first current state and the second current state back to the idle state.

As an example, in a non-activated state, the reset superconducting latch 214 is superconducting to provide a zero resistance current path for the load current $I_L$ in either the first or the second current state. In response to receiving the activation signal $ACT_R$, the reset superconducting latch 214 can be configured to switch to the voltage state to cease current flow (e.g., provide resistance) in the current path of the load current $I_L$ through the inductor 212. Accordingly, based on the balanced arrangement of the superconducting bidirectional current driver 200, the load current $I_L$ is diverted from the current path through the inductor 212 and the reset superconducting latch 214, and thus the input current $I_S$ becomes divided at the input node 202. As a result, the input current $I_S$ flows substantially equally as the currents $I_{L1}$ through the respective current paths of the superconducting latches 204 and 208 and the superconducting latches 206 and 210. Therefore, the superconducting bidirectional current driver 200 is set to the idle state from one of the first current state and the second current state.

Figure 6:
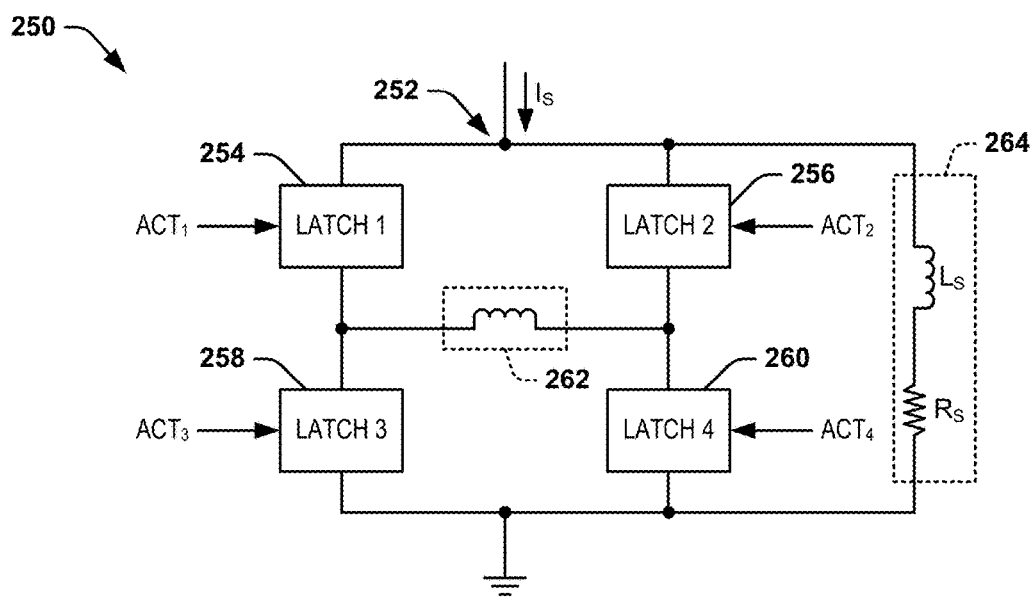
FIG. 6 illustrates a further example of a superconducting bidirectional current driver.

FIG. 6 illustrates a further example of a superconducting bidirectional current driver 250. The superconducting bidirectional current driver 250 can correspond to the superconducting bidirectional current driver 16 in the example of FIG. 1. Therefore, reference is to be made to the example of FIG. 1 in the following description of the example of FIG. 6.

In the example of FIG. 6, the superconducting bidirectional current driver 250 is demonstrated as an H-bridge circuit that is arranged between a node 252 and a low-voltage rail, demonstrated as ground. The input current $I_S$ is provided to the node 252, such as from the current source 14. The superconducting bidirectional current driver 250 includes a first superconducting latch 254, a second superconducting latch 256, a third superconducting latch 258, and a fourth superconducting latch 260 that are arranged in an H-bridge formation with respect to a bidirectional current load, demonstrated as an inductor 262. In the example of FIG. 6, the superconducting latch 254 is demonstrated as being activated via a respective activation signal $ACT_1$, the superconducting latch 256 is demonstrated as being activated via a respective activation signal $ACT_2$, the superconducting latch 258 is demonstrated as being activated via a respective activation signal $ACT_3$, and the superconducting latch 260 is demonstrated as being activated via a respective activation signal $ACT_4$. As an example, the activation signals $ACT_1$, $ACT_2$, $ACT_3$, and $ACT_4$ are provided by the activation controller 20. For example, the superconducting latches 254, 256, 258, and 260 are configured as quantum flux devices (e.g., SQUIDs) that are configured to switch to a voltage state in response to the respective activation signals $ACT_1$, $ACT_2$, $ACT_3$, and $ACT_4$, and can thus switch back to a superconducting state from the voltage state after expiration of a predetermined duration of time, similar to as described previously.

Therefore, the superconducting bidirectional current driver 250 can be configured similar to the superconducting bidirectional current driver 50 in the example of FIGS. 2-4. Accordingly, the superconducting bidirectional current driver 250 can be switched from the idle state to one of the first current state and the second current state, similar to as described previously in the examples of FIGS. 2-4, respectively. Additionally, the superconducting bidirectional current driver 250 further includes a shunt current path 264 interconnecting the input node 252 and the low-voltage rail. In the example of FIG. 6, the shunt current path 264 includes an inductor $L_S$ and a resistor $R_S$ arranged in series between the input node 252 and the low-voltage rail. The shunt current path 264 is configured to provide a current path for the input current $I_S$ in response to concurrent activation of at least the superconducting latch 254 and the superconducting latch 256. As an example, in the absence of the shunt current path 264, concurrent activation of the superconducting latches 254 and 256 or the superconducting latches 258 and 260, such as based on a race condition or other timing error, would result in the input current $I_S$ latching the superconducting latches 254 and 256 in the voltage state. As a result, the superconducting latches 254 and 256 would remain in the voltage state indefinitely, which would result in inoperability of the superconducting bidirectional current driver 250. Accordingly, the shunt current path 264 provides an escape path for the input current $I_S$ to the low-voltage rail to allow the superconducting latches 254 and 256 to return to the superconducting state for fault recovery capability. It is to be understood that the shunt current path 264 can likewise be included in the superconducting bidirectional current driver 200 in the example of FIG. 5.

Figure 7:
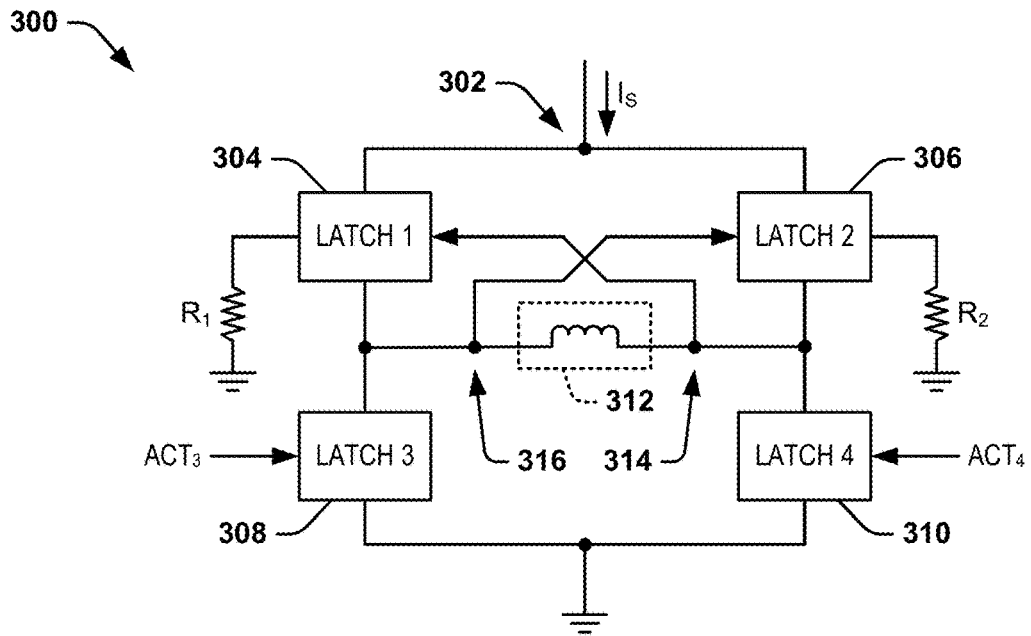
FIG. 7 illustrates yet another example of a superconducting bidirectional current driver.

FIG. 7 illustrates yet another example of a superconducting bidirectional current driver 300. The superconducting bidirectional current driver 300 can correspond to the superconducting bidirectional current driver 16 in the example of FIG. 1. Therefore, reference is to be made to the example of FIG. 1 in the following description of the example of FIG. 7.

In the example of FIG. 7, the superconducting bidirectional current driver 300 is demonstrated as an H-bridge circuit that is arranged between a node 302 and a low-voltage rail, demonstrated as ground. The input current $I_S$ is provided to the node 302, such as from the current source 14. The superconducting bidirectional current driver 300 includes a first superconducting latch 304, a second superconducting latch 306, a third superconducting latch 308, and a fourth superconducting latch 310 that are arranged in an H-bridge formation with respect to a bidirectional current load, demonstrated as an inductor 312. For example, the superconducting latches 304, 306, 308, and 310 are configured as quantum flux devices (e.g., SQUIDs), similar to as described previously. Additionally, the superconducting bidirectional current driver 300 could include a reset superconducting latch and/or a shunt current path, similar to as described previously in the examples of FIGS. 5 and 6. Therefore, the superconducting bidirectional current driver 300 can be configured similar to the superconducting bidirectional current driver 50 in the example of FIGS. 2-4.

In the example of FIG. 7, the superconducting latch 304 is demonstrated as being coupled to a node 314 corresponding to a first end of the inductor 312 and the superconducting latch 306 is demonstrated as being coupled to a node 316 corresponding to a second end of the inductor 312. Additionally, the superconducting latches 304 and 306 each include a resistive path to the low-voltage rail (e.g., ground), via respective resistors $R_1$ and $R_2$. The resistive paths through the respective resistors $R_1$ and $R_2$ can have high resistance values to ensure that the superconducting latches 306 and 308 are activated as a pair and that the superconducting latches 304 and 310 are likewise activated as a pair. The superconducting latch 308 is demonstrated as being activated via a respective activation signal $ACT_3$, and the superconducting latch 310 is demonstrated as being activated via a respective activation signal $ACT_4$. As an example, the activation signals $ACT_3$ and $ACT_4$ are provided by the activation controller 20.

Similar to as described previously, the superconducting latches 308 and 310 are configured to switch to a voltage state in response to the respective activation signals $ACT_3$ and $ACT_4$. However, in the example of FIG. 7, in response to the superconducting latch 308 being switched to the voltage state via the activation signal $ACT_3$, the superconducting latch 306 is likewise switched to the voltage state via the conductive coupling of the superconducting latch 306 to the node 316. Particularly, in the voltage state of the superconducting latch 308 provides a voltage at the node 316, which can be sufficient to provide sufficient stimulation of the superconducting latch 306 to activate the superconducting latch 306. Accordingly, the node 316 behaves as an activation signal, similar to the activation signal $ACT_2$, in response to activation of the superconducting latch 308. Similarly, in response to the superconducting latch 310 being switched to the voltage state via the activation signal $ACT_4$, the superconducting latch 304 is likewise switched to the voltage state via the conductive coupling of the superconducting latch 304 to the node 314. Particularly, in the voltage state of the superconducting latch 310 provides a voltage at the node 314, which can be sufficient to provide sufficient stimulation of the superconducting latch 304 to activate the superconducting latch 304. Accordingly, the node 314 behaves as an activation signal, similar to the activation signal $ACT_1$, in response to activation of the superconducting latch 310.

Accordingly, the superconducting bidirectional current driver 300 can be configured to mitigate timing problems that can occur with respect to activation of the superconducting latches 304, 306, 308, and 310. For example, depending on the location of inputs of the superconducting latches 304, 306, 308, and 310 relative to each other, and/or depending on timing associated with generating the activation signals $ACT_1$, $ACT_2$, $ACT_3$, and $ACT_4$, the complementary pairs of the superconducting latches 304 and 310 and the superconducting latches 306 and 308 could be activated sequentially, as opposed to concurrently, which could cause problems with controlling the direction of the load current $I_L$ through the inductor 312. Therefore, by implementing only a pair of activation signals $ACT_3$ and $ACT_4$ that are mutually exclusively activated, and by implementing the nodes 314 and 316 as respective activation signals of the superconducting latches 304 and 306, the concurrent activation of the complementary pairs of the superconducting latches 304 and 310 and the superconducting latches 306 and 308 can be ensured. Accordingly, timing problems associated with activation of the complementary pairs of the superconducting latches 304 and 310 and the superconducting latches 306 and 308 can be mitigated.

Figure 8:
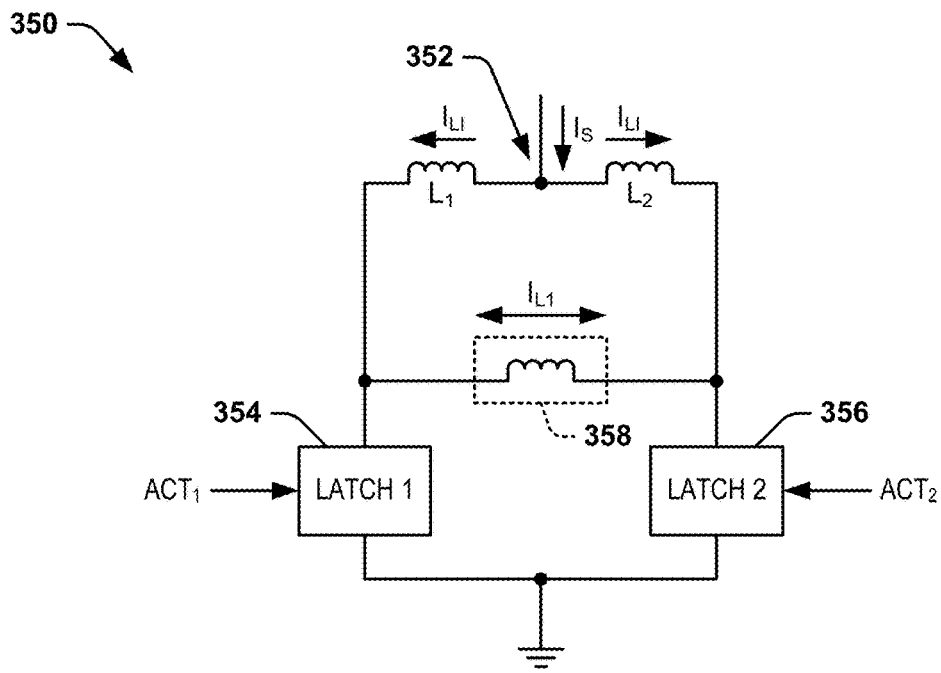
FIG. 8 illustrates yet a further example of a superconducting bidirectional current driver.

FIG. 8 illustrates yet a further example of a superconducting bidirectional current driver 350. The superconducting bidirectional current driver 350 can correspond to the superconducting bidirectional current driver 16 in the example of FIG. 1. Therefore, reference is to be made to the example of FIG. 1 in the following description of the example of FIG. 8.

In the example of FIG. 8, the superconducting bidirectional current driver 350 is demonstrated as an A-bridge circuit that is arranged between a node 352 and a low-voltage rail, demonstrated as ground. The input current $I_S$ is provided to the node 352, such as from the current source 14. The superconducting bidirectional current driver 350 includes a first superconducting latch 354 and a second superconducting latch 356 that are coupled to a bidirectional current load, demonstrated as an inductor 358. For example, the superconducting latches 354 and 356 are configured as quantum flux devices (e.g., SQUIDs), similar to as described previously. The superconducting bidirectional current driver 350 also includes a first inductor $L_1$ interconnecting the input node 352 and the first superconducting latch 354, and a second inductor $L_2$ interconnecting the input node 352 and the second superconducting latch 356. As an example, the inductors $L_1$ and $L_2$ can have an inductance value that is significantly greater than the inductor 358 (e.g. by at least an order of magnitude). Accordingly, the inductors $L_1$ and $L_2$ and the superconducting latches 354 and 356 form an A-bridge arrangement with respect to the inductor 358. Additionally, the superconducting bidirectional current driver 350 could include a reset superconducting latch and/or a shunt current path, similar to as described previously in the examples of FIGS. 5 and 6.

In the example of FIG. 8, the input current $I_S$ is demonstrated as being divided to flow through the inductors $L_1$ and $L_2$ as the currents $I_{L1}$, each corresponding to half the amplitude of the input current $I_S$, similar to as described in the example of FIG. 2. In an idle state, the currents $I_{L1}$ would thus flow through the superconducting latches 354 and 356 and not the inductor 358, similar to as described previously, based on the balanced superconducting arrangement of the superconducting bidirectional current driver 350. However, in response to activation of the superconducting latch 354 via the activation signal $ACT_1$, the current $I_{L1}$ flowing through the inductor $L_1$ is diverted from flowing through the superconducting latch 354 to flow through the inductor 358 in the first direction, and thus in the first current state. However, based on the large inductance of the inductors $L_1$ and $L_2$ relative to the inductor 358, the current $I_{L1}$ that flows through the inductor $L_2$ continues to flow through the inductor $L_2$ after activation of the superconducting latch 354, and combines with the current $I_{L1}$ that flows through the inductor 358, such that the full load current $I_L$ flows through the superconducting latch 356 to the low-voltage rail in the first current state. Therefore, in the first current state, the superconducting bidirectional current driver 350 provides the load current $I_{L1}$ through the inductor 358, which can be approximately one half of the amplitude of the load current $I_L$ through the inductive loads demonstrated in the superconducting bidirectional current drivers 50, 200, 250, and 300 in the respective examples of FIGS. 2-7, given an equal amplitude of the current source $I_S$ and inductive loading of the bidirectional current driver 350.

Similarly, in response to activation of the superconducting latch 356 via the activation signal $ACT_2$, the current $I_{L1}$ flowing through the inductor $L_2$ (or the full load current $I_L$) is diverted from flowing through the superconducting latch 356. Thus, similar to as described previously, based on the large inductance of the inductors $L_1$ and $L_2$ relative to the inductor 358, the current $I_{L1}$ that flows through the inductor $L_1$ ceases to flow through the inductor 358, and instead continues to flow through the superconducting latch 354. The current $I_{L1}$ that flows through the inductor $L_2$, however, ceases to flow through the superconducting latch 356 and begins to flow through the inductor 358 in the second direction in the second current state. The current $I_{L1}$ that flows through the inductor $L_1$ combines with the current $I_{L1}$ that flows through the inductor 358 in the second direction, such that the full load current $I_L$ flows through the superconducting latch 354 to the low-voltage rail in the second current state.

Therefore, the superconducting bidirectional current driver 350 operates substantially similar to the superconducting bidirectional current drivers 50, 200, 250, and 300 in the respective examples of FIGS. 2-7, but with approximately half the amplitude of the load current through the inductor 358. However, the superconducting bidirectional current driver 350 can be fabricated in a more compact and simplistic manner, and can be controlled in a more simplistic manner using only two activation signals $ACT_1$ and $ACT_2$.

Figure 9:
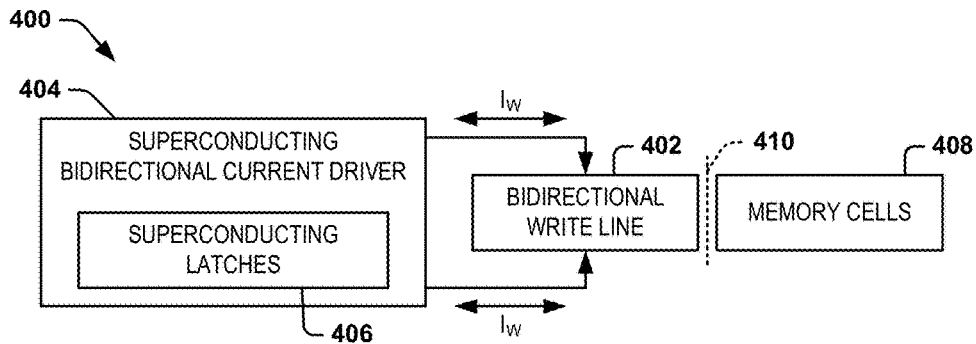
FIG. 9 illustrates an example of a superconducting bidirectional memory write current driver system.

FIG. 9 illustrates an example of a superconducting bidirectional memory write current driver system 400. The superconducting bidirectional memory write current driver system 400 can correspond to a system for controlling write operations in a memory system, such as a Josephson Magnetic Random Access Memory (JMRAM) that requires bidirectional current for writing binary logic states based on bidirectional current flow through a bidirectional current load, demonstrated in the example of FIG. 9 as a bidirectional write line 402, that is configured as an inductive load. As an example, the bidirectional write line 402 can correspond to a bit-write line associated with a column of a memory array or a word-write line associated with a row of a memory array.

The superconducting bidirectional current driver system 400 includes a superconducting bidirectional current driver 404 that receives an input current $I_S$, such as from a current source (e.g., the current source 14 in the example of FIG. 1, such as a flux-shuttle loop) and is configured to provide the input current $I_S$ through the bidirectional write line 402 as a write current $I_W$ in one of a first direction or a second direction. In the example of FIG. 9, the superconducting bidirectional current driver 404 includes a plurality of superconducting latches 406 that are selectively activated to control the direction of the write current $I_W$ through the bidirectional write line 402. The superconducting latches 406 are activated via respective activation signals ACT, such as provided from the activation controller 20. The activation signals ACT can activate the respective superconducting latches 406 that correspond to the desired direction of the write current $I_W$ through the bidirectional write line 402. As an example, the activation signals ACT can be provided as single flux quantum (SFQ) pulses or reciprocal quantum logic (RQL) pulses. The superconducting bidirectional current driver 404 can correspond to any of the superconducting bidirectional current drivers 50, 200, 250, 300, and 350 of the respective examples of FIGS. 2-8.

In the example of FIG. 9, the bidirectional write line 402 is inductively coupled to a memory cells 408, as indicated via dotted line 410. As an example, the memory cells 408 can correspond to a set of memory cells associated with a given row or column of the respective memory array. The inductive coupling 410 thus provides that the write current $I_W$ through the bidirectional write line 402 induces a magnetic field on the memory cells 408, such as to set a hysteretic memory state of one or more of the memory cells 408 (e.g., based on another write current (e.g., unidirectional) that is provided on a row or column that crosses the row or column associated with the bidirectional write line 402). The direction of the write current $I_W$ through the bidirectional write line 402 can thus dictate the direction of the magnetic field induced on memory cells 408. Accordingly, the superconducting bidirectional memory write current driver system 400 can control write operations for a given row or column of a memory array based on providing the bidirectional write current $I_W$ through the bidirectional write line 402.

Figure 10:
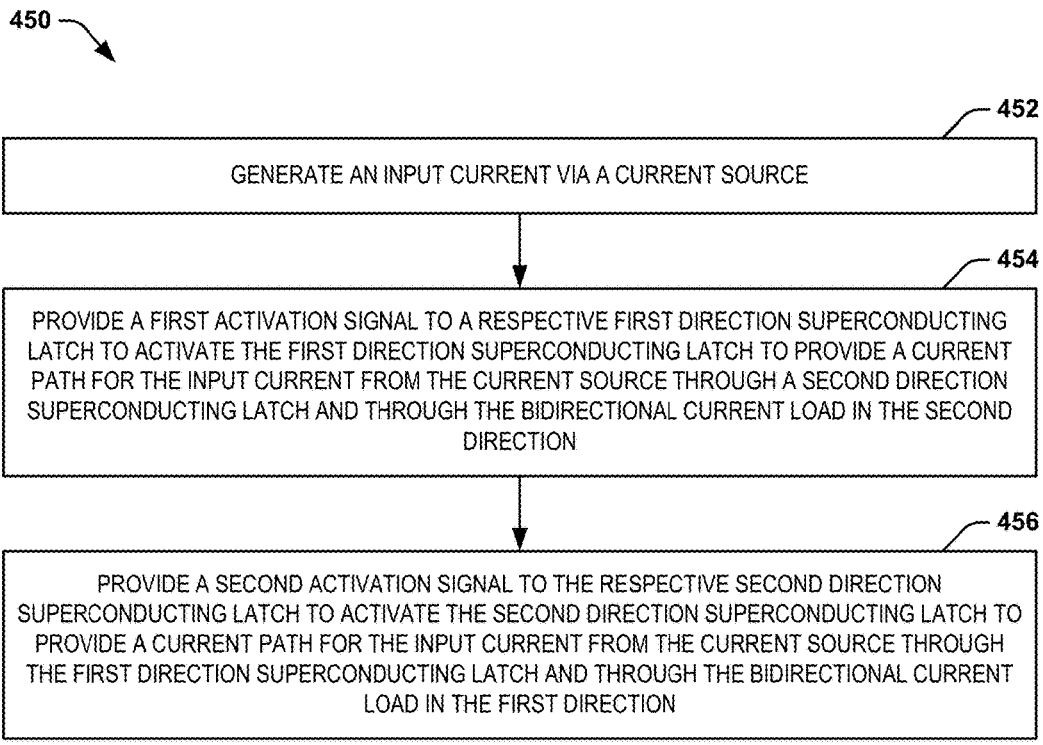
FIG. 10 illustrates an example of a method for providing a superconducting current through a bidirectional current load in a first direction or a second direction.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 450 for providing a superconducting current (e.g., the load current $I_L$ or the load current $I_{L1}$) through a bidirectional current load (e.g., the bidirectional current load 12) in a first direction (e.g., in the first current state in the diagram 50) or a second direction (e.g., in the second current state in the diagram 100). At 452, an input current (e.g., the input current $I_S$) is generated via a current source (e.g., the current source 14). At 454, a first activation signal (e.g., of the activation signals ACT) is provided to a respective first direction superconducting latch (e.g., of the superconducting latches 18) to activate the first direction superconducting latch to provide a current path for the input current from the current source through a second direction superconducting latch (e.g., of the superconducting latches 18) and through the bidirectional current load in the second direction. At 456, a second activation signal (e.g., of the activation signals ACT) is provided to a respective second direction superconducting latch (e.g., of the superconducting latches 18) to activate the second direction superconducting latch to provide a current path for the input current from the current source through the first direction superconducting latch (e.g., of the superconducting latches 18) and through the bidirectional current load in the first direction.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting bidirectional current driver comprising:
   a first direction superconducting latch that is activated in response to a first activation signal; and
   a second direction superconducting latch that is activated in response to a second activation signal,
   wherein the second direction superconducting latch is activated to provide a first current path of an input current through the first direction superconducting latch and through a bidirectional current load in a first direction,
   wherein the first direction superconducting latch is activated to provide a second current path of the input current through the second direction superconducting latch and through the bidirectional current load in a second direction opposite the first direction.

2. The current driver of claim 1, wherein each of the first direction superconducting latch and second direction superconducting latch is configured as a quantum flux device configured to be activated in response to the respective first and second activation signals provided from an activation controller to set the respective first direction superconducting latch or second direction superconducting latch to a voltage state in response to triggering of at least one Josephson junction.

3. The current driver of claim 1, wherein the superconducting bidirectional current driver is configured as an H-bridge circuit, wherein the first direction superconducting latch comprises a given first direction superconducting latch coupled between a current source and a first end of the bidirectional current load and another first direction superconducting latch coupled between a second end of the bidirectional current load and a low-voltage rail, and wherein the second direction superconducting latch comprises a given second direction superconducting latch coupled between the current source and the second end of the bidirectional current load and another first direction superconducting latch coupled between the first end of the bidirectional current load and the low-voltage rail.

4. The current driver of claim 3, further comprising a reset latch interconnecting the bidirectional current load and a node coupling the given first direction superconducting latch and the other second direction superconducting latch, the reset latch being activated to return the superconducting bidirectional current driver from a current state in which the input current is provided through the bidirectional current load to an idle state in which no current is provided through the bidirectional current load.

5. The current driver of claim 3, further comprising a shunt current path interconnecting the current source and the low-voltage rail, wherein the shunt current path is configured to provide a current path for the input current in response to concurrent activation of at least the given first direction and second direction superconducting latches.

6. The current driver of claim 3, wherein the first end of the bidirectional current load is coupled as an activation input to the given second direction superconducting latch and wherein the second end of the bidirectional current load is coupled as an activation input to the given first direction superconducting latch, wherein the given first direction superconducting latch is activated in response to activation of the other first direction superconducting latch via a first activation signal provided from an activation controller, and wherein the given second direction superconducting latch is activated in response to activation of the other second direction superconducting latch via a second activation signal provided from the activation controller.

7. The current driver of claim 1, wherein the superconducting bidirectional current driver is configured as an A-bridge circuit, wherein the first direction superconducting latch is coupled between a first end of the bidirectional current load and a low-voltage rail, wherein the second direction superconducting latch is coupled between a second end of the bidirectional current load and the low-voltage rail, the superconducting bidirectional current driver further comprising:
   a first inductor interconnecting the current source and the first direction superconducting latch; and
   a second inductor interconnect the current source and the second direction superconducting latch.

8. The current driver of claim 1, wherein the current source is configured as a flux shuttle loop current source configured to generate the input current in a storage inductor, the storage inductor being configured to provide the input current to the bidirectional current driver.

9. A memory write driver comprising the bidirectional current driver of claim 1, wherein the bidirectional current load is configured as a bidirectional inductive current load that is inductively coupled to at least one of a row or a column of a memory array, wherein the bidirectional inductive current load is configured to provide a write current a first direction to write a first memory state based on the input current being provided through the bidirectional inductive current load in the first direction, and to provide the write current on the write line in a second direction opposite the first direction to write a second memory state based on the input current being provided through the bidirectional inductive current load in the second direction.

10. A method for providing a superconducting current through a bidirectional current load in a first direction or a second direction, the method comprising:
   generating an input current via a current source;
   providing a first activation signal to a respective first direction superconducting latch to activate the first direction superconducting latch to provide a current path for the input current from the current source through a second direction superconducting latch and through the bidirectional current load in the second direction; and
   providing a second activation signal to the respective second direction superconducting latch to activate the second direction superconducting latch to provide a current path for the input current from the current source through the first direction superconducting latch and through the bidirectional current load in the first direction.

11. The method of claim 10, wherein providing the first activation signal comprises providing the first activation signal to the respective first direction superconducting latch configured as a quantum flux device to set the first direction superconducting latch in a voltage state, and wherein providing the second activation signal comprises providing the second activation signal to the respective second direction superconducting latch configured as a quantum flux device to set the second direction superconducting latch in the voltage state.

12. The method of claim 10, wherein providing the first activation signal comprises activating a given first direction superconducting latch coupled between the current source and a first end of the bidirectional current load and activating another first direction superconducting latch coupled between a second end of the bidirectional current load and a low-voltage rail, and wherein providing the second activation signal comprises activating a given second direction superconducting latch coupled between the current source and the second end of the bidirectional current load and activating another second direction superconducting latch coupled between the first end of the bidirectional current load and the low-voltage rail.

13. The method of claim 12, wherein activating the other first direction superconducting latch comprises activating the other first direction superconducting latch in response to activating the given first direction superconducting latch based on a conductive coupling of the second end of the bidirectional current load to the given first direction superconducting latch, and wherein activating the other second direction superconducting latch comprises activating the other second direction superconducting latch in response to activating the given second direction superconducting latch based on a conductive coupling of the first end of the bidirectional current load to the given first direction superconducting latch.

14. The method of claim 10, further comprising providing a third activation signal to a reset latch coupled to the bidirectional current load to activate the reset latch to cease flow of the input current through the bidirectional current load.

15. The method of claim 10, wherein providing the first activation signal comprises activating a first direction superconducting latch coupled between a first end of the bidirectional current load and a low-voltage rail to provide the current path for the input current from the current source through a first inductor interconnecting the current source and the first end of the bidirectional current load, through the bidirectional current load in the second direction, and through the second direction superconducting latch to the low-voltage rail; and
wherein providing the second activation signal comprises activating a second direction superconducting latch coupled between a second end of the bidirectional current load and the low-voltage rail to provide the current path for the input current from the current source through a second inductor interconnecting the current source and the second end of the bidirectional current load, through the bidirectional current load in the first direction, and through the first direction superconducting latch to the low-voltage rail.

16. A superconducting bidirectional memory write current driver comprising:
a current source configured to generate an input current;
a write line associated with at least one of a row or a column of a memory array, the write line being configured to write a first memory state of at least one memory cell of the respective at least one of the row or the column based on the input current being provided through the write line in a first direction and to write a second memory state of the at least one memory cell of the respective at least one of the row or the column based on the input current being provided through the write line in a second direction opposite the first direction;
a superconducting bidirectional current driver comprising:
a first direction superconducting latch that is activated in response to a first activation signal; and
a second direction superconducting latch that is activated in response to a second activation signal,
wherein the second direction superconducting latch is activated to provide a first current path of the input current through the first direction superconducting latch and through the write line in the first direction,
wherein the first direction superconducting latch is activated to provide a second current path of the input current through the second direction superconducting latch and through the write line in the second direction.

17. The memory write current driver of claim 16, wherein the superconducting bidirectional current driver is configured as an H-bridge circuit, wherein the first direction superconducting latch comprises a given first direction superconducting latch coupled between the current source and a first end of the bidirectional current load and another first direction superconducting latch coupled between a second end of the bidirectional current load and a low-voltage rail, and wherein the second direction superconducting latch comprises a given second direction superconducting latch coupled between the current source and the second end of the bidirectional current load and another first direction superconducting latch coupled between the first end of the bidirectional current load and the low-voltage rail.

18. The memory write current driver of claim 17, further comprising a reset latch interconnecting the bidirectional inductive current load and a node coupling the given first direction superconducting latch and the other second direction superconducting latch, the reset latch being activated to return the superconducting bidirectional current driver from a current state in which the input current is provided through the bidirectional inductive current load to an idle state in which no current is provided through the bidirectional inductive current load.

19. The memory write current driver of claim 17, wherein the first end of the bidirectional current load is coupled as an activation input to the given second direction superconducting latch and wherein the second end of the bidirectional current load is coupled as an activation input to the given first direction superconducting latch, wherein the given first direction superconducting latch is activated in response to activation of the other first direction superconducting latch via a first activation signal provided from an activation controller, and wherein the given second direction superconducting latch is activated in response to activation of the other second direction superconducting latch via a second activation signal provided from the activation controller.

20. The memory write current driver of claim 16, wherein the superconducting bidirectional current driver is configured as an A-bridge circuit, wherein the first direction superconducting latch comprises a first direction superconducting latch coupled between a first end of the bidirectional current load and a low-voltage rail, wherein the second direction superconducting latch comprises a second direction superconducting latch coupled between a second end of the bidirectional current load and the low-voltage rail, the superconducting bidirectional current driver further comprising:
a first inductor interconnecting the current source and the first direction superconducting latch; and
a second inductor interconnecting the current source and the second direction superconducting latch.

* * * * *